United States Patent
Johnson

[11] Patent Number: 5,861,065
[45] Date of Patent: Jan. 19, 1999

[54] NITROGEN TRIFLUORIDE-OXYGEN THERMAL CLEANING PROCESS

[75] Inventor: Andrew David Johnson, Doylestown, Pa.

[73] Assignee: Air Products and Chemicals, Inc., Allentown, Pa.

[21] Appl. No.: 792,917

[22] Filed: Jan. 21, 1997

[51] Int. Cl.$^6$ .................................................. B08B 9/00
[52] U.S. Cl. .................... 134/22.1; 134/2; 134/22.18; 134/36
[58] Field of Search ................ 134/1, 1.1, 1.3, 134/2, 22.1, 22.18, 21, 34, 36

[56] References Cited

U.S. PATENT DOCUMENTS

| | | | |
|---|---|---|---|
| Re. 30,505 | 2/1981 | Jacob | 156/643 |
| 4,374,698 | 2/1983 | Sanders et al. | 156/643 |
| 4,522,681 | 6/1985 | Gorowitz et al. | 156/643 |
| 4,568,410 | 2/1986 | Thornquist | 156/643 |
| 4,786,352 | 11/1988 | Benzing | 134/1 X |
| 4,787,957 | 11/1988 | Barkanic et al. | 156/643 |
| 5,158,644 | 10/1992 | Cheung et al. | 134/1 X |
| 5,382,316 | 1/1995 | Hills et al. | 134/1 X |
| 5,421,957 | 6/1995 | Carlson et al. | 216/58 |

FOREIGN PATENT DOCUMENTS 2183204   6/1987   United Kingdom ............ C04B 41/91

*Primary Examiner*—Jill Warden
*Assistant Examiner*—Alexander Markoff
*Attorney, Agent, or Firm*—Geoffrey L. Chase

[57] ABSTRACT

A method for the dynamic cleaning of semiconductor fabrication equipment and particularly quartzware with thermally activated nitrogen trifluoride and a source of oxygen at elevated temperatures, typically at the process operation temperature, wherein the cleaning effluent is safely removed and cleaning by-products isolated or diluted to provide for efficient cleaning and rapid restarts of fabrication equipment so cleaned.

9 Claims, 2 Drawing Sheets

520 torr, 600 C, 30%(3.0SLM)

NITROGEN TRIFLUORIDE-OXYGEN THERMAL CLEANING PROCESS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention is directed to the field of thermal cleaning with nitrogen trifluoride and an oxygen source etchant mixture. More specifically, the present invention is directed to cleaning various silicon-containing semiconductor substances from wafers and chemical vapor deposition equipment, including reaction vessels and hardware, using a dynamic flow of nitrogen trifluoride and an oxygen source at elevated temperatures with a unique process.

The semiconductor industry has experienced a long-felt need to solve the problem of cleaning chemical vapor deposition furnaces and quartz tubes in the furnaces as well as quartz hardware of various undesired substances such as silicon nitride, polycrystalline silicon, titanium silicide, tungsten silicide and various other silicides, as well as silicon dioxide, which are typically present as undesired films on furnaces and quartz hardware during their deposition on silicon wafers and chips being processed as electronic materials and integrated circuits.

The normal procedure for cleaning is to remove the parts, such as those made of quartz, metals or other materials from a furnace, such as quartz furnace tubes, and perform a wet chemical cleaning. O-ring seals would typically have to be replaced in such an operation, as well as cleaning of lines, doors and other vacuum components. Another alternative is to use another piece of equipment and perform a plasma cleaning. The wet chemical cleaning is very costly and time consuming. When the equipment is shut down to pull the quartz parts, it can require up to 18 hours of time. Also, the system necessitates reverification for its operating integrity before it can be used again. Direct cleaning application requires special chemicals, equipment and sinks to perform this cleaning. Another disadvantage is that the quartzware is attacked at accelerated rates which affects its reproducibility and reliability of operation. This is especially true when cleaning quartz racks or wafer holders. These components have special slots cut in the quarts to hold the parts being coated, and when the wet chemical clean attacks the quartz, it affects the dimensions of these slots. When the slots are affected, the parts being held are not coated uniformly, which requires the quartz be replaced at accelerated scheduling.

The plasma cleaning method requires the use of another piece of equipment especially designed to perform a cleaning of quartz tubes in place within the chemical vapor deposition furnace equipment. First, the plasma cleaning method does not clean the other quartz parts which are used in the chemical vapor deposition furnace system. This means these parts will need to be chemically wet cleaned, separate and apart from plasma cleaning methods. Also, the plasma cleaning equipment takes up space in the manufacturing area, and may prevent other tubes from being used in the system while it is being utilized. If the quartz parts are replaced with another material like silicon carbide, it will make the plasma system application unreliable.

Methods of using nitrogen trifluoride have been attempted but never have been brought to the marketplace. One such method was performed in a static mode that allowed by-products to condense on the cooler walls of the system. This caused a dangerous condition when these by-products were not evacuated before returning the system to the atmosphere. This called for extended purging times and reduced the benefits of this method. It also allowed for possible dangerous gas mixtures to develop in the system's vacuum components that may mix with gases which are normally utilized to deposit films on the wafers. One nitrogen trifluoride cleaning method is discussed in UK Patent Appln. GB2183204 where nitrogen trifluoride is used in a static mode and suggestion for use in a continuous flowing mode is also set forth. This patent application does not address the means or methods for removing cleaning by-products, the treatment of by-products once removed or the use of nitrogen trifluoride with any other gases.

U.S. Pat. No. 5,421,957 discloses a nitrogen trifluoride cleaning process for semiconductor process reactors and apparatus by controlling the moisture content during the clean operation to be less than 10 parts per million by volume. Inert carrier gases for the nitrogen trifluoride are disclosed such as nitrogen, helium, argon or the like. The concentration of the inert was from 95.5% to 80% of the etchant mixture.

U.S. Reissue Pat. No. 30,505 discloses a process for plasma etching of a solid material with a binary mixture comprising essentially oxygen and a halocarbon wherein at least one carbon atom in said molecule is linked to a predominance of fluorine atoms. At the temperatures recited (25°–300° C.) there is no reaction between the binary gas mixture and the solid material to be etched. Temperatures in excess of 1000° C. are necessary to thermally dissociate halocarbons, making this gas impractical for thermal cleaning of semiconductor process equipment.

U.S. Pat. No. 4,374,698 describes an etch process for differential etching of silicon nitride from silicon dioxide using the combination of carbon tetrafluoride and a halofluorocarbon. The gas etchant may include oxygen or nitrous oxide. A plasma is necessary to dissociate the halocarbon into species that will react with the solid material. The role of the oxygen source in this patent is to volatilize the carbon products into CO and $CO_2$. Without oxygen, this process would coat the process equipment with teflonlike material, defeating the usefulness of the process for cleaning.

U.S. Pat. No. 4,522,681 discloses a method for etching holes in silicon dioxide wherein a dry plasma etch gas of argon, nitrogen trifluoride and oxygen may be used. Polymeric photoresist materials such as polymethyl methacrylate, ethyl methacrylate, methyl isopropyl ketone as well as copolymers thereof with methacrylic acid may be used. This class of photoresist materials was required, versus standard novel AC photoresists, to successfully practice the invention. Plasma is necessary to dissociate the fluorine compound into specie that will etch the substrate. The role of the oxygen is to etch the photoresist and not the substrate.

U.S. Pat. No. 4,568,410 discloses a dry plasma etch process for etching silicon nitride using nitrogen trifluoride and oxygen. Good results for etching silicon nitride were found with relative percentages of the nitrogen trifluoride to oxygen recited at column 5, line 65 to be 10–20 SCCM of $NF_3$ in comparison to 20–35 SCCM for oxygen. The gases are also disclosed as capable of etching common resists.

U.S. Pat. No. 4,787,957 is directed to a method for plasma desmear and etchbac of epoxy and polyimide materials from a multilayered or double sided printed circuit board using a plasma gas composition in the range of 20–45% $NF_3$, the remainder being $O_2$.

The prior art has failed to address a commercially successful process for cleaning semiconductor materials or equipment using a gaseous source to produce volatile cleaning by-products which are readily removed from the materials or equipment after cleaning is accomplished. In addition, the prior art has not addressed a viable method for removal of cleaning by-products and collection of such by-products (which typically may be reactive and toxic) for safe, easy disposal when servicing chemical vapor deposition equipment and materials treated in such equipment. The prior art has not addressed a method for using nitrogen trifluoride in combination with other gases so as to permit elevated furnace temperatures with controlled etch rates and with minimum down time for etch cleaning. The prior art has not utilized oxygen to enhance the thermal etch of semiconductor materials with nitrogen trifluoride. The present invention as set forth below overcomes these drawbacks of the prior art.

BRIEF SUMMARY OF THE INVENTION

The present invention is a thermal process for cleaning equipment surfaces in semiconductor manufacturing using diluted nitrogen trifluoride, comprising:

(a) initially evacuating a zone contacting the equipment surfaces;

(b) maintaining the zone at an elevated temperature sufficient to thermally disassociate nitrogen trifluoride;

(c) flowing an etchant mixture of nitrogen trifluoride and a source of oxygen through the zone, the source of oxygen present in the range of approximately 1% to 30%, of the etchant mixture by volume; and (d) cleaning undesired substances on the equipment surfaces by chemical reaction of the nitrogen trifluoride and/or fluorine cleaning reagents disassociated from nitrogen trifluoride with the substances to form volatile reaction products.

Preferably, the elevated temperature of step (b) is in the range of approximately 300° to 1000° C.

More preferably, the elevated temperature of step (b) is in the range of approximately 400° to 600° C.

Most preferably, the flow of the etchant mixture is in the range of approximately 1 to 10 standard liters per minute.

Preferably, the source of oxygen is selected from the group consisting of oxygen, ozone, water, nitric oxide, nitrous oxide, nitrogen dioxide, silicon dioxide and mixtures thereof.

Preferably, the etchant mixture includes an inert gas selected from the group consisting of nitrogen, argon, helium and mixtures thereof.

Preferably, the initial evacuation is at a pressure of no greater than 600 torr, the flow of diluted nitrogen trifluoride is at a pressure of no greater than 750 torr and the heating is at a temperature of no greater than 400°–600° C.

Preferably, the nitrogen trifluoride is present in the range of approximately 1 to 50% by volume of the etchant mixture.

Preferably, the undesired substances are selected from the group consisting of silicon nitride, siliconoxynitride, silicon dioxide, polysilicon and mixtures thereof.

DETAILED DESCRIPTION OF THE INVENTION

Figure 1:
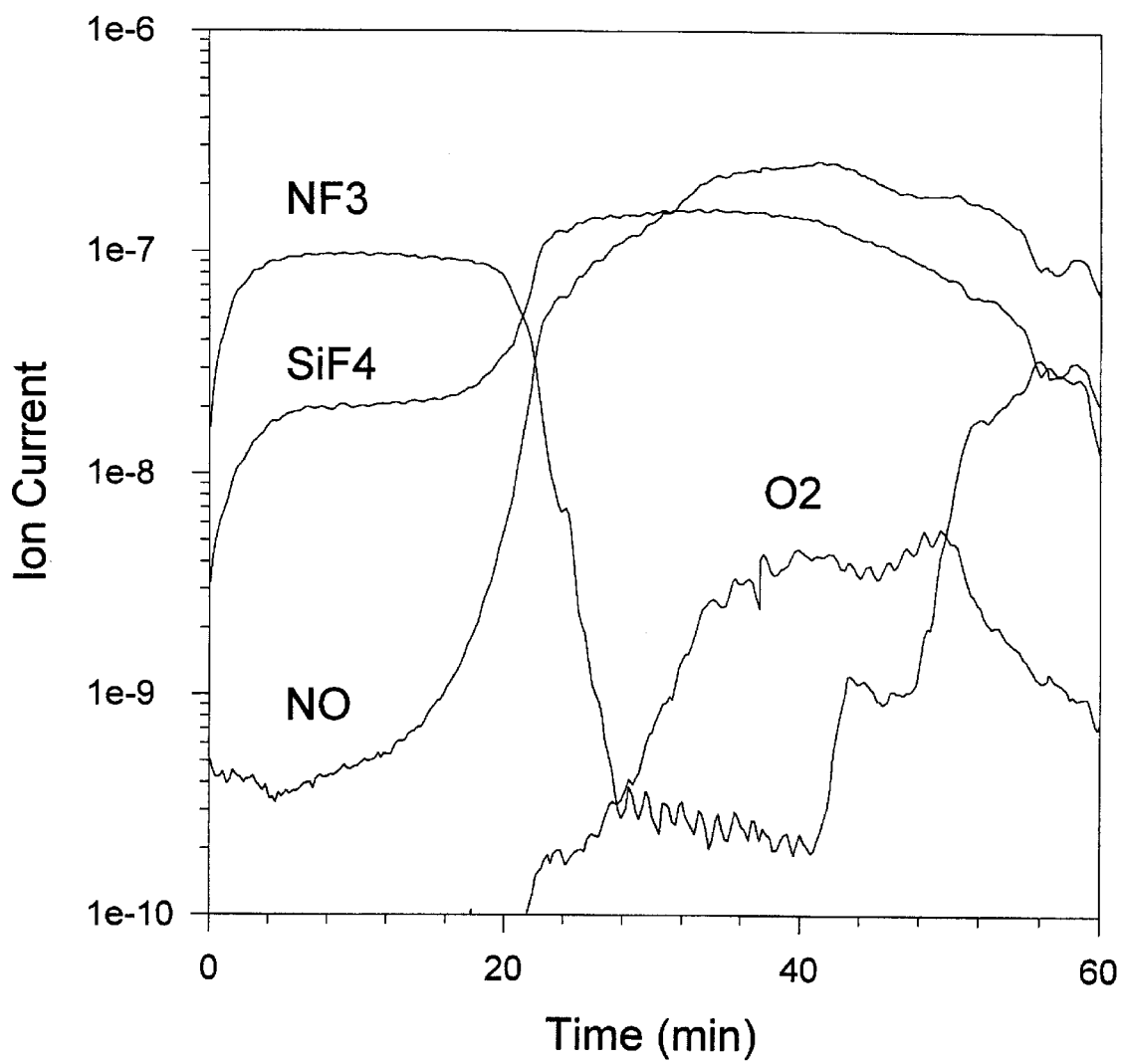
FIG. 1 is a graph of nitrogen trifluoride, silicon tetrafluoride, nitric oxide and oxygen during a nitrogen trifluoride clean not using the process of the present invention. The graph is clean time vs. ion content from the clean zone. The etch was at a pressure of 520 torr, 600° C., 30% nitrogen trifluoride and a flow of 3.0 standard liters per minute.

A process has been developed for in-situ thermal cleaning of equipment such as process chambers, boats and/or tool pieces in a semiconductor electronic fabrication facility using nitrogen trifluoride and a source of oxygen at elevated temperature. The present invention achieves rapid initiation of the clean or etch process because of the synergistic action of oxygen with the nitrogen trifluoride. The presence of oxygen, particularly at the initiation of the clean process, provides for rapid initiation of the clean without the delays of the prior art clean processes.

The present invention reduces the cost to clean commonly used quartzware parts and metal roughing lines used in semiconductor and electronic manufacturing equipment by allowing their surfaces to be cleaned in-situ without removal of such surfaces from the process system and without significant reduction in the temperature that the equipment operates at under normal manufacturing operation and by reducing the time required to effect cleaning. This is uniquely possible with the process of the present invention because the nitrogen trifluoride with the added source of oxygen does not require or experience any substantial initiation time before the thermal cleaning reaction begins at commercially desirable rates. This is a significant benefit because process equipment downtime is critical to economic operation and having to include an extended initiation time is undesirable.

The present invention does not require a retrofit that utilizes a radio frequency power supply and means of applying radio frequency to surfaces for activation energy to decompose nitrogen trifluoride to produce cleaning reagent such as required in plasma processes. The present invention also eliminates the use of other equipment used for current methods of cleaning, such as to remove quartzware or roughing lines for cleaning in aqueous acids and deionized water in large, semi-automated ventilated tanks. The present invention eliminates what chemical wastes and possible operator exposure to hazardous acids and solvents used in current cleaning systems.

The present invention involves thermally cleaning a typical process chamber including the parts arrayed within a chamber of a semiconductor or electronic fabrication facility by evacuating the chamber. Nitrogen trifluoride with a source of oxygen, preferably diluted with an inert gas such as nitrogen, argon, helium or mixtures thereof to provide an etchant mixture is then introduced via a gas supply means, such as a gas control manifold, into the process chamber and associated roughing manifold and the cleaning process is conducted at a pressure in the range of about 400–750 torr using the thermal energy of approximately 300° to 1000° C., preferably 400° to 600° C., available from the existing equipment heating system to decompose or disassociate the nitrogen trifluoride and produce a fluorine cleaning reagent, such as ionic or free fluorine. The fluorine cleaning reagent produced from the decomposition or disassociation of nitrogen trifluoride under thermal degradation are effective against deposits of silicon nitride, siliconoxynitride, silicon dioxide, polycrystalline silicon, titanium silicide, tungsten silicide, refractory metals and their various suicides. The fluorine cleaning reagent produced from the decomposition or disassociation of nitrogen trifluoride has minimal effect on quartz tube furnaces or quartzware used within such furnaces. The source of oxygen can be oxygen or a source of oxygen such as ozone, water, nitric oxide, nitrous oxide, nitrogen dioxide, silicon dioxide or mixtures thereof. The oxygen source is preferably present in a range of approximately 1% to 30% by volume of the etchant mixture.

Upon completion of the cleaning process, the nitrogen trifluoride source is turned off and the system pumped under vacuum, preferably with heated and temperature controlled pressurized gas, for 15 minutes followed by a purge with nitrogen for at least one-half hour while under vacuum.

This invention enhances the thermal $NF_3$ process used to clean low pressure chemical vapor deposition (LPCVD) $Si_3N_4$ and polysilicon tubes. The current process uses a $NF_3$(30%)/$N_2$ gas mixture at a temperature of 500° C. to 600° C. and a pressure of 400 to 600 torr. The stoichiometry of the overall reaction that removes the $Si_3N_4$ film is:

$$Si_3N_4 + 4NF_3 \rightarrow 3SiF_4 + 4N_2$$

and for the polysilicon film is:

$$3Si + 4NF_3 \rightarrow 3SiF_4 + 2N_2$$

Because $NF_3$ and $SiF_4$ are, respectively, etch reactants and products, the $Si_3N_4$ etch rate is directly proportional to the $NF_3$ consumption and $SiF_4$ partial pressure. FIG. 1 shows the gas composition while cleaning 5 μm of $Si_3N_4$ from an LPCVD tool. The process temperature and pressure are 600° C. and 520 torr, respectively, and $NF_3$(30%)/$N_2$ is introduced at time zero. The $NF_3$ partial pressure remains high for ~20 min. after which time it decreases by a factor of 500. Accompanying the dramatic $NF_3$ drop is a tenfold increase in the $SiF_4$ concentration. The partial-pressure profile shows that the $Si_3N_4$ etch rate increases dramatically after 20 minutes, resulting in consumption of all of the $NF_3$ (i.e., the $Si_3N_4$ etch rate is now limited by the $NF_3$ flow). The cause of this etch increase is a clearing of the $Si_3N_4$ film at the tube inlet to expose the underlying quartz ($SiO_2$). Support for this hypothesis is the appearance of NO and $O_2$ in the profile (FIG. 1) which is evidence of quartz etching.

$$3SiO_2 + 4NF_3 \rightarrow 3SiF_4 + 4NO + O_2$$

Figure 2:
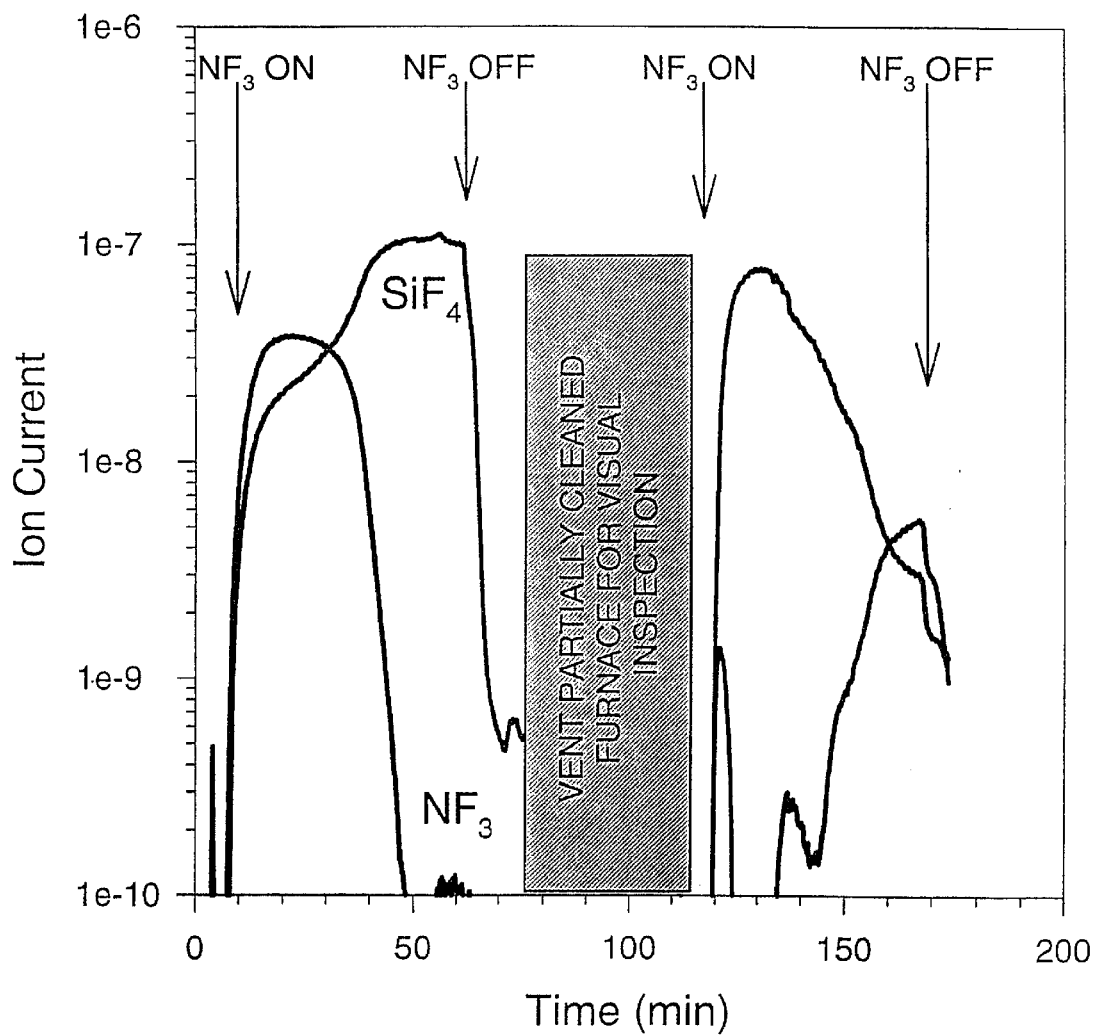
FIG. 2 is a graph of a nitrogen trifluoride clean under similar conditions of FIG. 1 but in which the clean was stopped and then restarted. On the restart, no delay in clean was noticed indicating that oxygen accelerated the clean initiation.

In addition to this evidence from the QMS profile, a visual inspection after the initiation step showed the $NF_3$ clean to be incomplete. FIG. 2 shows the time evolution of the $NF_3$ and $SiF_4$ partial pressure while cleaning 5 μm of $Si_3N_4$. The process temperature and pressure are 600° C. and 500 torr, respectively, and $NF_3$(30%)/$N_2$ is introduced after 10 minutes. An initiation period lasting ~30 minutes was again observed before all of the $NF_3$ is consumed and the accompanying tenfold increase in the $SiF_4$ partial pressure and $Si_3N_4$ etch rate. At the start of the main etch (40 minutes) the clean is interrupted by turning off the $NF_3$ gas flow and purging etch products from the system with $N_2$. The furnace tube was then vented to atmosphere and the wafer boat removed. While the $Si_3N_4$ film was starting to clear from the top of the boat, most surfaces were still coated with $Si_3N_4$. The wafer boat was loaded back into the furnace and the clean restarted. The $NF_3$(30%)/$N_2$ process gas was reintroduced after 120 minutes. When the clean was restarted, no initiation time was observed. The profile of this partial clean (FIG. 2) shows that when the underlying quartz is exposed and $O_2$ is added to the process gas, the initiation time is eliminated.

These observations suggest that the underlying quartz supplies oxygen to the process gas, increasing the $Si_3N_4$ etch rate by more than a factor of 10. By deliberately doping the process gas with oxygen, e.g., $NF_3$(30%)/$O_2$/$N_2$, the initiation period can be eliminated and the time to clean the LPCVD tube shortened by a factor of two. It is believed that the added oxygen provides additional pathways for the volatilization of $Si_3N_4$:

$$Si_3N_4 + O_2 + NF_3 \rightarrow SiF_4 + NO_x + N_2$$

or decomposition of $NF_3$:

$$2NF_3 + O_2 \rightarrow 2NO + 6F$$

The enhanced thermal $NF_3/O_2$ clean process involves:

1. Cooling the furnace to the cleaning temperature (400° C. to 600° C.).
2. Isolate LPCVD tube from the process pump with a bypass valve.
3. Fill the LPCVD tube with $N_2$ while pumping with a vacuum source.
4. Introduce the process gas:
   $NF_3$(30%)/Oxygen source (1–30%)/$N_2$
   Pressure 400 to 600 torr
   Gas flow 1 to 10 SLM
5. Flow process gas until all the $Si_3N_4$ or polysilicon has been removed.
6. Stop flowing process gas.
7. Purge etch products from system with $N_2$.

The most significant feature of the present invention is that the process is executed in a dynamic flow mode using nitrogen fluoride and a source of oxygen at approximate process temperatures with only thermal activation.

Typically the nitrogen trifluoride can be thermally activated to degrade and produce the fluorine cleaning reagent at elevated temperatures between 300° C. and 1000° C., preferably 400° to 600° C.

During the course of chemical vapor deposition of materials in the quartz tubes, deposition occurs on various appliances and carriers within the quartz tubes, as well as on the quartz tube surfaces themselves. At some point in time one or more of the appliances and/or tubes must be taken out of service for cleaning. Although in the present illustration, the cleaning process will be exemplified by all of the quartz tubes being cleaned simultaneously, it is understood by appropriate manifolding, a quartz tube or appliances may be independently or separately cleaned, while other tubes remain in service.

Having described the present invention with regard to a preferred embodiment, it is apparent that the nitrogen trifluoride and oxygen source etchant mixture cleaning process of the present invention provides a number of benefits over the prior art, including: using thermal activation with heat sources typically already in place in quartz tube furnaces; avoidance of requirements for energy sources of plasma systems, the ability to clean system components in place; reduction in maintenance down time for cleaning; lower cost of cleaning and capital investment to effect appropriate cleaning procedures; the elimination of wet chemical cleaning materials and procedures; providing a cleaning method which does not require recalibration of the process chamber or furnace of the semiconductor fabrication facility prior to reinitiation of production runs; provision of a safe method for cleaning by using an isolated evacuation system from the manufacturing process apparatus vacuum system; providing a beneficial method of cleaning system quartzware and boats with minimal damage and handling; providing a method to insure fast by-product removal and economic cleaning process cycles, and providing a method which allows for rapid initiation of the clean or etch process at commercially attractive rates. In addition, the cleaning method of the present invention can be used to clean other types of process equipment, including stand alone cleaning equipment, stainless steel door flanges, vacuum conduits, exhaust piping, equipment of stainless steel, aluminum and ceramic, etc.

In addition, the total time required to be off-line from process operation is shorter using the nitrogen trifluoride and source of oxygen etchant mixture of the present invention at elevated or process temperatures, because of the elimination or significant reduction in the lengthy time to cool a furnace and reheat the furnace for safe temperature operation if concentrated or pure nitrogen trifluoride were used and rapid initiation of clean or etch rates without the typical delayed rates of the prior art. Maintaining a furnace at or near steady-state temperatures is also more advantageous for the useful life of an expensive quartz furnace tube, wherein the stress of significant temperature changes is avoided.

The present invention has been described with reference to a preferred embodiment, however, it should be appreciated that the full scope of the present invention should be ascertained from the claims which follow.

I claim:

1. A thermal process for cleaning equipment surfaces in semiconductor manufacturing using nitrogen trifluoride, comprising:

(a) initially evacuating a zone contacting said equipment surfaces;

(b) maintaining said zone at an elevated temperature sufficient to thermally disassociate nitrogen trifluoride in the range of approximately 300° C. to 1000° C.;

(c) flowing an etchant mixture of nitrogen trifluoride and a source of oxygen through said zone, said source of oxygen in the range of approximately 1% to 30% of the etchant mixture; and (d) cleaning undesired substances on said equipment surfaces by chemical reaction of said nitrogen trifluoride and/or fluorine cleaning reagents disassociated from nitrogen trifluoride with said substances to form volatile reaction products without generating a plasma.

2. The process of claim 1 wherein said elevated temperature of step (b) is in the range of approximately 400° C. to 600° C.

3. The process of claim 1 wherein said flowing of said etchant mixture is in the range of approximately 1 to 10 standard liters per minute.

4. The process of claim 1 wherein said source of oxygen is selected from the group consisting of oxygen, ozone, water, nitric oxide, nitrous oxide, nitrogen dioxide, silicon dioxide and mixtures thereof.

5. The process of claim 1 wherein said etchant mixture includes an inert gas selected from the group consisting of nitrogen, argon, helium and mixtures thereof.

6. The process of claim 1 wherein said initial evacuation is at a pressure of no greater than 600 torr, said flowing of etchant mixture is at a pressure of no greater than 750 torr and said elevated temperature is at a temperature of 400°–600° C.

7. The process of claim 1 wherein said nitrogen trifluoride is present in the range of approximately 1 to 50% by volume of the etchant mixture.

8. The process of claim 1 wherein said undesired substances are selected from the group consisting of silicon nitride, siliconoxynitride, silicon dioxide, polysilicon and mixtures thereof.

9. The process of claim 1 wherein said elevated temperature of step (b) is approximately 600° C.

* * * * *